(12) United States Patent　　(10) Patent No.: US 7,420,285 B2
Hashimoto　　(45) Date of Patent: Sep. 2, 2008

(54) SEMICONDUCTOR DEVICE AND METHOD OF MANUFACTURING THE SAME, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/889,467

(22) Filed: Aug. 14, 2007

(65) Prior Publication Data

US 2007/0296088 A1　Dec. 27, 2007

Related U.S. Application Data

(63) Continuation of application No. 11/348,470, filed on Feb. 7, 2006, now Pat. No. 7,271,499, which is a continuation of application No. 11/115,205, filed on Apr. 27, 2005, now Pat. No. 7,038,323, which is a continuation of application No. 10/383,530, filed on Mar. 10, 2003, now Pat. No. 6,900,548, which is a continuation of application No. 09/985,074, filed on Nov. 1, 2001, now Pat. No. 6,583,516, which is a continuation of application No. 09/272,244, filed on Mar. 19, 1999, now Pat. No. 6,333,565.

(30) Foreign Application Priority Data

Mar. 23, 1998　(JP)　................................. 10-094007
Mar. 19, 1999　(JP)　................................. 11-075282

(51) Int. Cl.
*H01L 23/52*　(2006.01)
*H01L 23/48*　(2006.01)
*H01L 29/40*　(2006.01)

(52) U.S. Cl. ...................... 257/781; 257/779; 257/780; 257/773; 257/774; 257/737

(58) Field of Classification Search ......... 257/779–781, 257/773–774, 737
See application file for complete search history.

(56) References Cited

U.S. PATENT DOCUMENTS

| | | |
|---|---|---|
| 4,629,286 A | 12/1986 | Fuse et al. |
| 4,949,148 A | 8/1990 | Bartelink |
| 5,077,598 A | 12/1991 | Bartelink |
| 5,086,337 A | 2/1992 | Noro et al. |
| 5,189,505 A | 2/1993 | Bartelink |

(Continued)

FOREIGN PATENT DOCUMENTS

JP　A-6-21601　1/1994

(Continued)

*Primary Examiner*—Luan Thai
(74) *Attorney, Agent, or Firm*—Oliff & Berridge, PLC

(57) ABSTRACT

A semiconductor device comprising: a semiconductor element having a plurality of electrodes; a passivation film formed on the semiconductor element in a region avoiding at least a part of each of the electrodes; a conductive foil provided at a given spacing from the surface on which the passivation film is formed; an external electrodes formed on the conductive foil; intermediate layer formed between the passivation film and the conductive foil to support the conductive foil; and wires electrically connecting the electrodes to the conductive foil; wherein a depression tapered in a direction from the conductive foil to the passivation film if formed under a part of the conductive foil that includes the connection with the external electrodes.

8 Claims, 16 Drawing Sheets

U.S. PATENT DOCUMENTS

| | | | |
|---|---|---|---|
| 5,497,545 | A | 3/1996 | Watanabe et al. |
| 5,527,741 | A | 6/1996 | Cole et al. |
| 5,659,952 | A | 8/1997 | Kovac et al. |
| 5,707,881 | A | 1/1998 | Lum |
| 5,776,796 | A | 7/1998 | Distefano et al. |
| 5,777,391 | A | 7/1998 | Nakamura et al. |
| 5,777,780 | A | 7/1998 | Terada et al. |
| 5,834,844 | A * | 11/1998 | Akagawa et al. ............ 257/734 |
| 5,925,931 | A | 7/1999 | Yamamoto |
| 6,130,116 | A | 10/2000 | Smith et al. |
| 6,211,572 | B1 | 4/2001 | Fjelstad et al. |
| 6,255,737 | B1 | 7/2001 | Hashimoto |
| 6,279,226 | B1 | 8/2001 | Ohkubo et al. |
| 6,323,542 | B1 | 11/2001 | Hashimoto |
| 6,342,726 | B2 | 1/2002 | Miyazaki et al. |
| 6,498,396 | B1 | 12/2002 | Arimoto |
| 7,038,323 | B2 | 5/2006 | Hashimoto |

FOREIGN PATENT DOCUMENTS

| | | |
|---|---|---|
| JP | A-9-107048 | 4/1997 |
| JP | A-9-148475 | 6/1997 |
| JP | 410051062 A | 2/1998 |
| JP | A-2002-513510 | 5/2002 |
| WO | WO 95/08856 | 3/1995 |
| WO | WO 98/28793 | 7/1998 |

* cited by examiner

SEMICONDUCTOR DEVICE AND METHOD OF MANUFACTURING THE SAME, CIRCUIT BOARD, AND ELECTRONIC INSTRUMENT

This is a Continuation of application Ser. No. 11/348,470 filed Feb. 7, 2006, now U.S. Pat. No. 7,271,499 which in turn is a Continuation of application Ser. No. 11/115,205 filed Apr. 27, 2005, now U.S. Pat. No. 7,038,323 B2, which is a Continuation of application Ser. No. 10/383,530 filed Mar. 10, 2003, now U.S. Pat. No. 6,900,548, which in turn is a Continuation of application Ser. No. 09/985,074 filed Nov. 1, 2001, now U.S. Pat. No. 6,583,516, which in turn is a Continuation of application Ser. No. 09/272,244 filed Mar. 19, 1999, now U.S. Pat. No. 6,333,565. The disclosures of the prior applications are hereby incorporated by reference herein in their entirety.

BACKGROUND

The present invention relates to a semiconductor device and method of manufacture thereof, a circuit board and an electronic instrument.

As higher mounting density of semiconductor devices is demanded, bare-chip mounting is ideal. However, for bare chips, quality assurance and handling are difficult. In response to this, semiconductor devices have been developed to which Chip Scale/Size Package (CSP) technology is applied. There is no formal definition of CSP, but generally this refers to an IC package in which the package size is the same as or only very slightly larger than the chip size. The development of CSP technology is very important as high-density mounting advances. One prior art publication relating to CSP is International Patent Publication WO95/08856.

According to this, a gap is formed between a substrate having external electrodes and a semiconductor chip, and into this gap resin is injected. This resin is such as to have resilience once cured. By means of this resilient resin, stress (thermal stress) applied to the external electrodes is absorbed. It should be noted that this stress is caused by the difference in coefficient of thermal expansion between the semiconductor device and the circuit board on which the semiconductor device is mounted.

However, the resin injected between the semiconductor chip and the substrate is extremely thin, and for this reason it has not been possible adequately to absorb the thermal stress.

SUMMARY

The present invention solves this problem, and has as its object the provision of a semiconductor device and method of manufacture thereof, a circuit board and an electronic instrument such that thermal stress can be effectively absorbed.

(1) According to a first aspect of the present invention, there is provided a semiconductor device comprising:

a semiconductor element having a plurality of electrodes;

a passivation film formed on the semiconductor element in a region avoiding at least a part of each of the electrodes;

a conductive foil provided at a given spacing from the surface on which the passivation film is formed;

external electrodes formed on the conductive foil;

an intermediate layer formed between the passivation film and the conductive foil to support the conductive foil; and wires electrically connecting the electrodes to the conductive foil;

wherein a depression tapered in a direction from the conductive foil to the passivation film, is formed in the intermediate layer under a part of the conductive foil that includes the connection with the external electrodes.

The term "semiconductor element" relating to the present invention is not restricted to a semiconductor chip, but may also include reference to a wafer form not yet separated into chips. In other words, here a "semiconductor element" may be in any form so long as it is a portion of a base substrate formed of for example silicon on which a circuit is formed, and which can be used once in the separated state, or equally to the same while in the integral state.

According to this aspect of the present invention, the external electrodes are formed on the conductive foil, and the conductive foil is supported by the intermediate layer. A depression is formed in the intermediate layer, and the external electrodes are positioned over the depression. In other words, the external electrodes are not supported directly by the intermediate layer, but rather is floating on the intermediate layer. By this means, since the external electrodes are able to move relatively freely, the stress (thermal stress) generated by the difference in coefficient of thermal expansion with the circuit board can be absorbed.

(2) The depression may be filled with a resin having a Young's modulus lower than that of the intermediate layer.

In this way, since the space in the depression can be filled, the generation of cracks caused by the expansion of steam when heat is applied, for example during reflow processes, can be prevented.

(3) The wires may be formed on the surface on which the passivation film is formed, and may be positioned on the bottom surface of the intermediate layer depression; and the resin may have a conducting filler added, and may electrically connect the wires to the conductive foil.

(4) The intermediate layer may have a bevel between the electrodes and the conductive foil; and the wires may be formed on the bevel to electrically connect the electrodes to the conductive foil.

(5) The intermediate layer may be formed of a flexible material.

In this way, the intermediate layer itself can also relieve stress.

(6) The conductive foil may have a hole positioned within an opening edge of the depression and avoiding the connection with the external electrodes.

In this way, the conductive foil is more easily deformed, and stress can be absorbed by the conductive foil.

(7) The semiconductor device may further comprise a substrate with a surface on which the conductive foil is formed facing toward the intermediate layer; the substrate may have a penetrating hole over the depression; and the external electrodes may be formed on the conductive foil through the penetrating hole.

By means of this, the conductive foil is covered by the substrate and thus protected.

(8) A substrate formed of a flexible material may be provided between the intermediate layer and the conductive foil; the substrate may have a penetrating hole in a region avoiding above the depression; and the wires and the conductive foil may be electrically connected through the penetrating hole.

(9) The conductive foil and the wires may be formed integrally.

(10) The conductive foil and the wires may be formed separately.

(11) According to a second aspect of the present invention, there is provided a method of manufacturing a semiconductor device, comprising the steps of:

providing a semiconductor element that includes a plurality of electrodes and a passivation film that is formed on a surface of the semiconductor element in a region avoiding at least a part of each of the electrodes;

forming a conductive foil at a given spacing from the surface on which the passivation film is formed, an intermediate layer between the passivation film and the conductive foil to support the conductive foil, and a depression in the intermediate layer in a position to avoid the electrodes;

forming wires that connect electrically the electrodes to the conductive foil; and forming external electrodes on the conductive foil in a position above the depression.

With a semiconductor device manufactured according to this aspect of the present invention, the external electrodes are formed on the conductive foil, and the conductive foil is supported by the intermediate layer. A depression is formed in the intermediate layer, and the external electrodes are positioned over the depression. In other words, the external electrodes are not supported directly by the intermediate layer, but rather are floating on the intermediate layer. By this means, since the external electrodes are able to move relatively freely, the stress (thermal stress) generated by the difference in coefficient of thermal expansion with the circuit board can be absorbed.

(12) In the method of the present invention, a substrate may be provided, having a penetrating hole, and having the conductive foil adhered to a position including the position over the penetrating hole; the intermediate layer may be formed on the surface on which the passivation film is formed, and the depression may be formed in the intermediate layer; thereafter, the substrate may be mounted on the intermediate layer so that the penetrating hole is positioned over the depression and that the conductive foil is opposed to the depression; and the external electrodes may be formed on the conductive foil through the penetrating hole.

By means of this, since the conductive foil is adhered to the substrate, the step of forming the conductive foil can be carried out simply.

(13) In the method of the present invention, a substrate formed of a flexible material and having a penetrating hole may be provided; the intermediate layer may be formed on the surface on which the passivation film is formed, the depression may be formed on the intermediate layer, and the wires may be formed on the intermediate layer; and the substrate may be mounted on the intermediate layer with the penetrating hole positioned over the wires, the conductive foil may be formed on the substrate, and the wires and the conductive foil may be electrically connected through the penetrating hole.

By means of this, since the conductive foil is adhered to the substrate, the step of forming the conductive foil can be carried out simply.

(14) The intermediate layer may be formed on the surface on which the passivation film is formed, the conductive foil may be formed on the intermediate layer, a hole may be formed in the conductive foil, and the intermediate layer may be etched through the hole to form the depression.

(15) The intermediate layer may be formed of a material which can be etched under conditions in which the semiconductor element cannot be etched.

In this way, when the intermediate layer is etched, etching of the surface of the semiconductor element can be prevented.

(16) The passivation film may be etched under the etching conditions of the intermediate layer; and on the passivation film, a covering layer may be formed of a material which is not readily etched under the etching conditions of the intermediate layer, the intermediate layer may be formed on the covering layer, the conductive foil may be formed on the intermediate layer, a hole may be formed in the conductive foil, and the intermediate layer may be etched through the hole to form the depression.

In this way, by the formation of the covering layer on the passivation film, the passivation film is prevented from being etched.

(17) The passivation film may be etched under the etching conditions of the intermediate layer;

on the passivation film, a first covering layer may be formed of a material which is not readily etched under the etching conditions of the intermediate layer;

the intermediate layer may be formed on the first covering layer;

the conductive foil and wires may be formed on the intermediate layer, and a hole may be formed in the conductive foil;

a solder resist layer may be formed on the wires;

on the solder resist layer, a second covering layer may be formed of a material which is not readily etched under the etching conditions of the intermediate layer; and the intermediate layer may be etched as far as the underneath of the conductive foil through the hole in the conductive foil.

(18) The method of the present invention may further comprise, before the step of etching the intermediate layer, a step in which the external electrodes are formed on the conductive foil, and on the external electrodes an electrode covering layer is formed of a material which is not readily etched under the etching conditions of the intermediate layer.

By means of this, after the external electrodes are formed, the depression is formed by etching the intermediate layer. Therefore, since the residue created by the formation of the external electrodes are removed before carrying out etching, no residue remains in the depression.

(19) The method of the present invention may further comprise a step in which the depression is filled with a resin having a Young's modulus lower than that of the intermediate layer.

(20) According to a third aspect of the present invention, there is provided a circuit board on which is mounted the semiconductor device described above.

(21) According to a fourth aspect of the present invention, there is provided an electronic instrument having the circuit board described above.

DETAILED DESCRIPTION OF PREFERRED EMBODIMENTS

Figure 1:
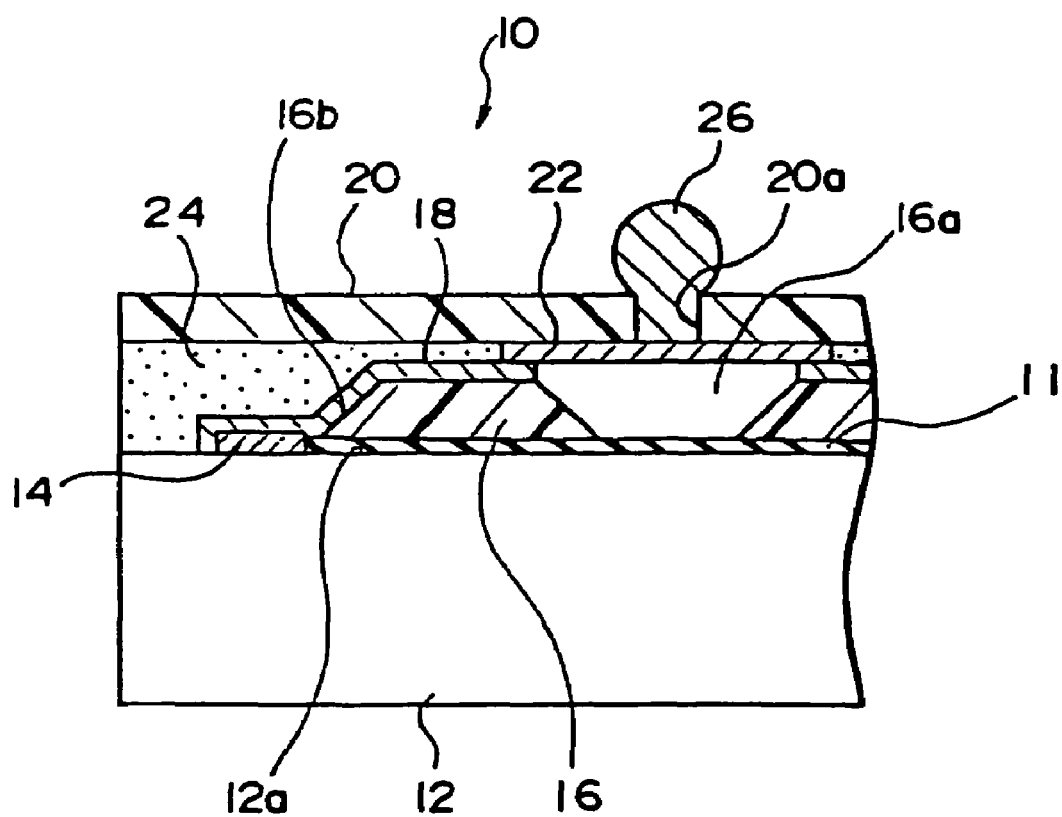
FIG. 1 is a sectional view showing a first embodiment of the semiconductor device.

The present invention is now described in terms of a number of preferred embodiments, with reference to the drawings.

It should be noted that in order to render the drawings more easily understandable, they are shown partially enlarged. In the description hereunder, because the final result envisaged is a single device, there may be slight inconsistencies in the terminology and grammar used. In the description hereunder, the term "semiconductor element" is employed, and this refers, as the words suggest, to a chip-form object, but the term "semiconductor element" relating to the present invention is not restricted to a semiconductor chip, but may also include reference to a wafer form not yet separated into chips. In other words, here a "semiconductor element" may be in any form so long as it is a portion of a base substrate formed of for example silicon on which a circuit is formed, and which can be used once in the separated state, or equally to the same while in the integral state. In the description of wires and the like, where necessary a representative portion only is discussed, and therefore other similar parts of the construction shown in the drawings and other parts of the construction are omitted.

First Embodiment

FIG. 1 is a sectional view showing a first embodiment of the semiconductor device. In this figure, a semiconductor device 10 is a CSP type with a package size approximately equal to a semiconductor chip 12.

On an active surface 12a of the semiconductor chip 12, a plurality of electrodes 14 of for example aluminum (Al) are formed. On the semiconductor chip 12 avoiding at least a part of each electrode 14, a passivation film 11 is formed. The passivation film is formed avoiding at least a part of each electrode because an electrical signal or the like has to be led from the electrode 14. Therefore, the passivation film 11 has to avoid the electrode 14 so that an electrical signal or the like can be led from the electrode. The passivation film can be formed of, for example, $SiO_2$, SiN, polyimide resin, or the like. On the active surface 12a, avoiding the electrode 14, an intermediate layer 16 is formed. In more detail, the intermediate layer 16 is formed on the passivation film not shown in the drawings. In the intermediate layer 16 a depression 16a is formed, and within the depression 16a the active surface 12a is exposed. It is sufficient for the depression 16a to be concave, and the active surface 12a is not necessarily exposed. The intermediate layer 16 has a bevel 16b sloping from the electrode 14, and a wire 18 is formed from the electrode 14 via the bevel 16b onto the intermediate layer 16. The opening outline of the depression 16a shown in FIG. 1 is considerably larger than the size of the root portion of the external electrode 26, but this is not limiting on the invention, and it may be approximately equal in size to the root portion of the external electrode 26 or not smaller than the same. The opening of the depression 16a may be positioned under a part of the root portion of the external electrode 26. In this case, this opening allows the deformation of the intermediate layer to achieve the stress absorption function. The depression 16a may be formed to penetrate the intermediate layer 16 and expose the underlying passivation film 11, but equally the bottom of the depression 16a may not penetrate the intermediate layer 16 and leave a portion of the intermediate layer 16.

Here, the intermediate layer 16 is formed of an insulating resin, for example polyimide resin, and when the semiconductor device 10 is mounted on a circuit board (not shown in the drawings), is able to absorb the stress generated by the difference in coefficient of thermal expansion between the semiconductor chip 12 and the circuit board on which it is mounted. It should be noted that the fact of the intermediate layer 16 having a stress absorption function is not an essential element of the present invention. The stress absorption function may also be achieved by forming the depression 16a (as described in detail below).

The insulating resin provides insulation to the wire 18, and can protect the active surface 12a of the semiconductor chip 12, providing heat resistance when the solder is fused during mounting. When the addition of the stress absorption function described below is considered, a polyimide resin or the like is generally used, and it is preferable to use one of these with a low Young's modulus (for example an olefin polyimide resin, or the Dow Chemical Company's BCB or the like as an example of other than a polyimide resin), and in particular, it is preferable that the Young's modulus be not more than about 300 kg/mm². The thicker the intermediate layer 16 is, the greater the stress absorbing ability, but when the size and cost of the semiconductor device are considered, a thickness of between 1 and 100 μm is preferable. However, when a polyimide resin with a Young's modulus on the order of 300 kg/mm² is used, a thickness of 10 μm or thereabouts will suffice.

Alternatively, as the intermediate layer 16 may be used, for example, a silicone denatured polyimide resin, epoxy resin, silicone denatured epoxy resin, or the like, and furthermore, a material with a low Young's modulus capable of effecting stress absorption may be used. As the intermediate layer 16, a passivation layer (SiN, $SiO_2$, MgO, or the like) may be formed, and the stress absorption as such may be provided as described below by the depression 16a being formed.

The wire 18 is formed of for example copper (Cu), chromium (Cr), titanium (Ti), nickel (Ni), titanium-tungsten (Ti—W), or a laminated plurality thereof, and thereon conductive foil 22 is formed. The conductive foil 22 is previously formed on a substrate 20, and is then adhered on the wire 18 together with the substrate 20, by means of an adhesive 24. It should be noted that the conductive foil 22 is also formed of for example copper (Cu).

The conductive foil 22 is formed to be larger than the opening outline of the depression 16a formed in the intermediate layer 16, and is disposed so as to cover the depression 16a. A part of the conductive foil 22 contacts the wire 18 and is electrically connected thereto. It should be noted that it is preferable for the conductive foil 22 and wire 18 to be welded together by the application of heat and pressure. The electrical connection between the conductive foil 22 and wire 18, may be achieved as described above by the mechanical adhesion of the adhesive 24, or the wire 18 and conductive foil 22 may be brazed together by plating with gold (Au), tin (Sn), solder, or the like on the two, or again they may be joined by diffusion bonding using ultrasonic welding or the like. For this reason, on at least one of the mating surfaces of the conductive foil 22 and wire 18, it is preferable to provide a low-temperature solder.

The substrate 20 is in the form of a film formed of a flexible resin or the like, and has a penetrating hole 20a formed over the depression 16a. It should be noted that the conductive foil 22 is formed so as to cover the penetrating hole 20a on the underside of the substrate 20. An external electrode 26 is formed on the conductive foil 22 so as to extend through the penetrating hole 20a. The external electrode 26 may be formed, for example, of solder only, or by plating the surface of copper (Cu) or nickel (Ni) with solder or gold.

It should be noted that the substrate 20 with attached conductive foil 22 may also be a two-layer (copper foil+polyimide substrate) or a three-layer (copper foil+adhesive+polyimide substrate) film carrier tape or Flexible Printed Circuit (FPC) used in TAB technology.

This embodiment is constructed as described above, and provides the following effect. In the semiconductor device 10, the conductive foil 22 on which the external electrode 26 is formed is supported by the intermediate layer 16. However, the intermediate layer 16 has the depression 16a formed in a region including immediately under the external electrode 26. By means of the depression 16a, a space is formed under the conductive foil 22. In other words, close to the junction with the external electrode 26, the conductive foil 22 is in a floating state, and is able to easily deform. Because of this construction, when stress is applied to the external electrode 26, the conductive foil 22 and substrate 20 deform, and thereby the stress can be absorbed. In this way, when the semiconductor device is mounted on a circuit board, or when the circuit board or electronic instrument in which it is mounted is subject to temperature variation, the resulting stress due to the difference in coefficient of thermal expansion between the semiconductor device (or semiconductor chip formed of silicon) and the circuit board, and the mechanical stress generated when bent by external stress, can be absorbed. Hereinbelow, the term "stress" refers to these.

Figure 2:
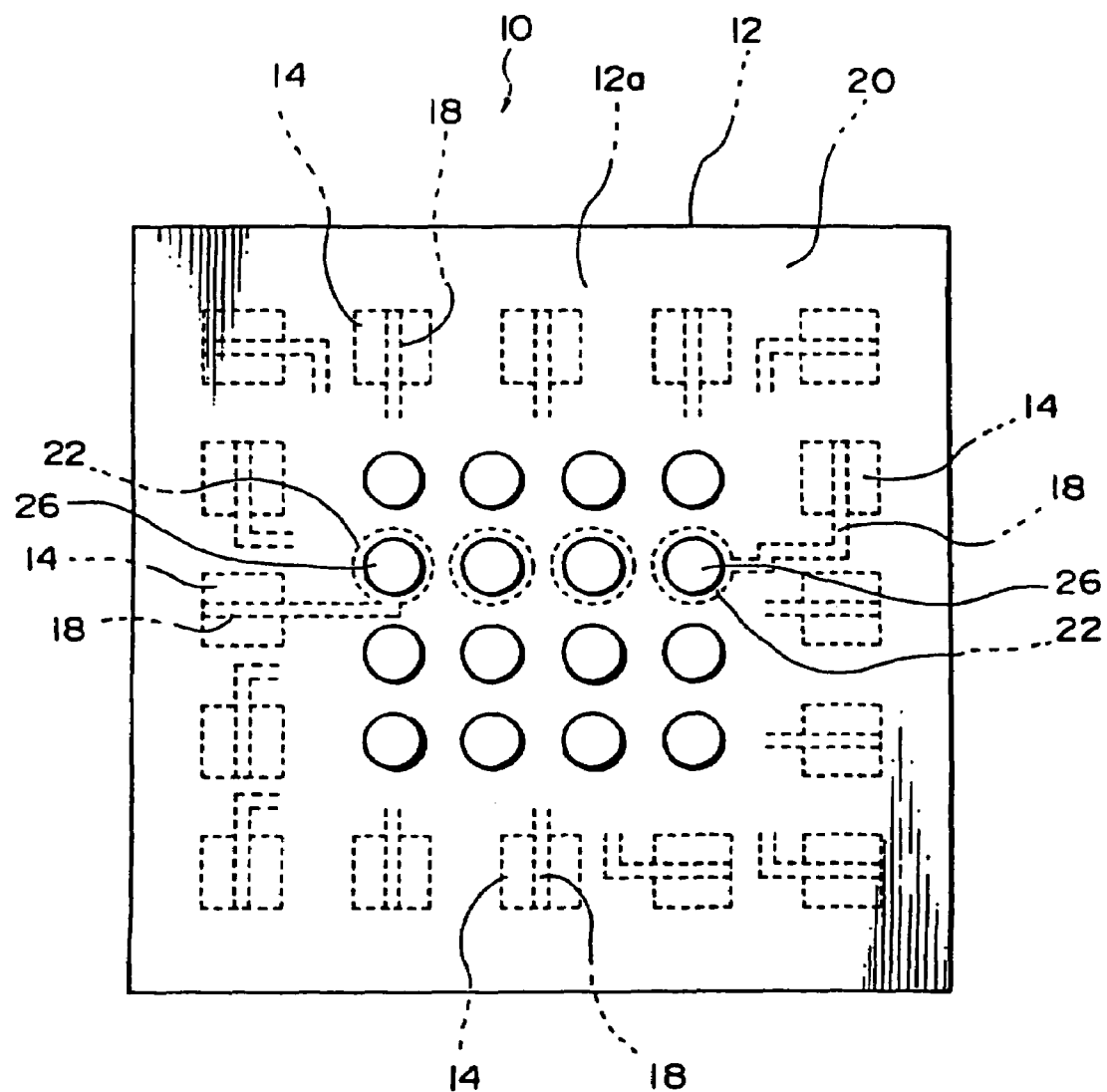
FIG. 2 is a plan view showing the first embodiment of the semiconductor device.

Next, FIG. 2 shows a plan view of this embodiment of the semiconductor device. In this figure, wires 18 are formed from the electrodes 14 of the semiconductor chip 12 toward the center of the active surface 12a, and to each wire 18 is connected the conductive foil 22, and on the conductive foil 22 are provided external electrodes 26. Except for the region of the external electrodes 26, the substrate 20 provides covering and protection.

The electrodes 14 are positioned around the periphery of the semiconductor chip 12, as an example of the so-called peripheral electrode form, but equally an area array type of semiconductor chip in which electrodes are formed in an interior region within the periphery of the semiconductor chip may be used.

It should be noted that as shown in this figure, the external electrodes 26 are provided not over the electrodes 14 of the semiconductor chip 12, but in the region of the active surface of the semiconductor chip 12 (the region in which the active element is formed). By providing the intermediate layer 16 in the active region, and further disposing (drawing-in) the wire 18 within the active region, the external electrodes 26 can be provided within the active region. In other words, a pitch conversion can be carried out. Therefore, the external electrodes 26 can be positioned within the active region, in other words, a region constituting a particular area, and the degree of freedom of positioning the external electrodes 26 is very greatly increased.

By bending the wire 18 at required positions, the external electrodes 26 can be arranged on a grid. It should be noted that this is not an essential element of the present invention, and thus the external electrodes 26 may equally be provided so as not to be arranged on a grid.

In FIG. 2, at the junction of the electrode 14 and wire 18, the width of the electrode 14 and the width of the wire 18 are such that: wire 18<electrode 14. But in practice, it is preferable that: electrode 14≦wire 18. In particular, when electrode 14<wire 18, not only is the resistance of the wire 18 reduced, but since the strength is increased wiring breaks are prevented.

It should be noted that in this embodiment, the intermediate layer 16 has a stress absorption function, but by the mere fact that the depression 16a is formed, the stress can be absorbed. As a result, even if the intermediate layer 16 is constructed as a layer of a material without a stress absorption function (for example a simple insulating layer or protective layer), stress absorption is possible.

Figure 3A:
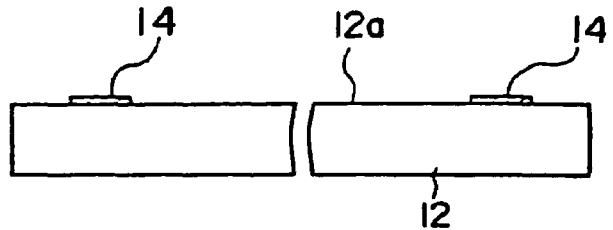
FIGS. 3A to 3E show the method of manufacturing the first embodiment of the semiconductor device.

Next, FIGS. 3A to 3E illustrate the method of manufacturing this embodiment of the semiconductor device. First, as shown in FIG. 3A, a semiconductor chip 12 having electrodes 14 of for example aluminum is readied. It should be noted that on the semiconductor chip 12, avoiding the electrode 14, a passivation film not shown in the drawings is formed. When the process of the present invention is applied to a semiconductor chip in wafer form, a commercially available wafer may be used. On the active surface 12a of the semiconductor chip 12, a polyimide resin not shown in the drawings is provided by spin coating or the like. Alternatively, a polyimide resin or the like in film form may be previously adhered to the active surface 12a.

Figure 3B:
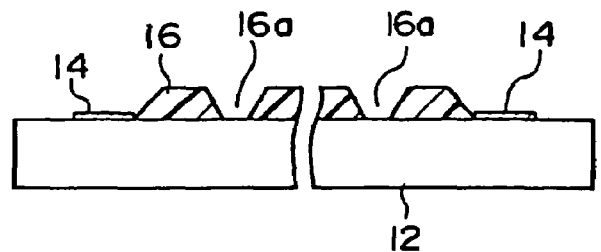

Next, by a process of photolithography, as shown in FIG. 3B, the intermediate layer 16 having the depression 16a is formed. It should be noted that when the depression 16a is formed by photolithography, it is preferable that a material appropriate therefor be selected for the intermediate layer 16.

Figure 3C:
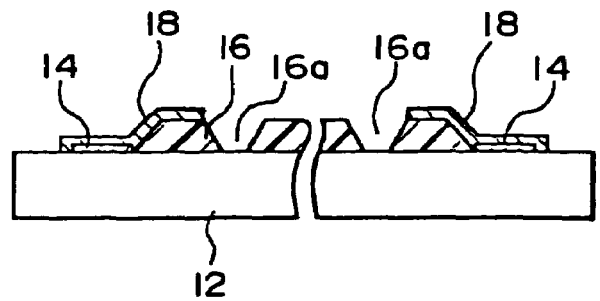

Next, as shown in FIG. 3C, a wire 18 is formed extending from the electrode 14 over the intermediate layer 16. For example, by sputtering a 100-angstrom ($10^{-10}$ m) layer of titanium-tungsten (Ti—W) is formed, then similarly by sputtering a 1 μm layer of copper (Cu) is formed thereon. The metal film thus obtained is then etched to a required pattern to form the wire 18.

Figure 3D:
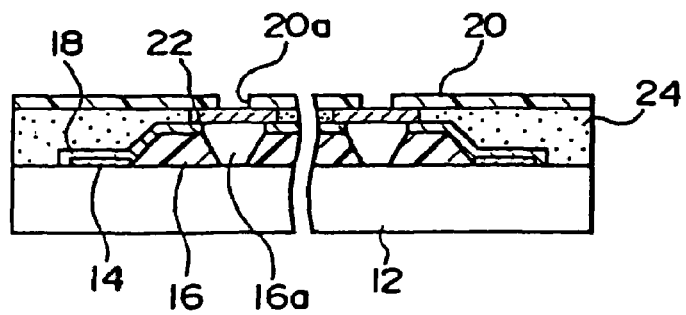

Then as shown in FIG. 3D, with an adhesive 24 interposed, the substrate 20 is adhered. In the substrate 20 a penetrating hole 20a has been previously formed, and in the position covering the penetrating hole 20a the conductive foil 22 is provided.

It should be noted that it is preferable that at least one of the mating surfaces of the conductive foil 22 and wire 18, is plated with for example, tin (Sn), gold (Au), or solder, and a low-temperature solder provided.

Next the substrate 20 is placed in position so that the conductive foil 22 contacts the wire 18, and heat and pressure is applied from above the substrate 20. In this way, the low-temperature solder fuses, and the conductive foil 22 and wire 18 are electrically connected. This connection may also be carried out by the application of ultrasound or the like.

Figure 3E:
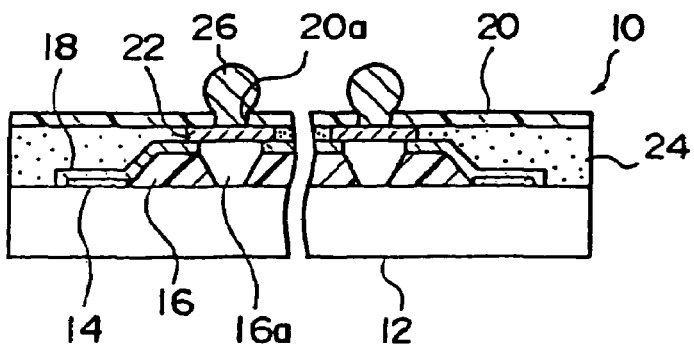

Next, as shown in FIG. 3E, the external electrode 26 is formed on the conductive foil 22 so as to extend through the penetrating hole 20a of the substrate 20. For example, solder balls may be placed on the conductive foil 22, solder plating may be applied, a solder paste may be printed, or plating with copper (Cu) or nickel (Ni) or both may be carried out and further solder or gold (Au) plating carried out to form the external electrode 26.

By means of the above process, the semiconductor device 10 can be obtained. It should be noted that in the case that the semiconductor chip 12 is in wafer form, dicing is then carried out to yield the semiconductor device 10. The semiconductor device 10 is then subjected to quality inspection and packed in trays.

It should be noted that in this embodiment, the wire 18 is formed on the level 16b, but may equally be formed on the bevel on the side of the depression 16a. The same is also true of the following embodiments. If this is done, the majority of the wire 18 passes over the intermediate layer 16 and is protected, thus improving the device reliability.

Second Embodiment

Figure 4:
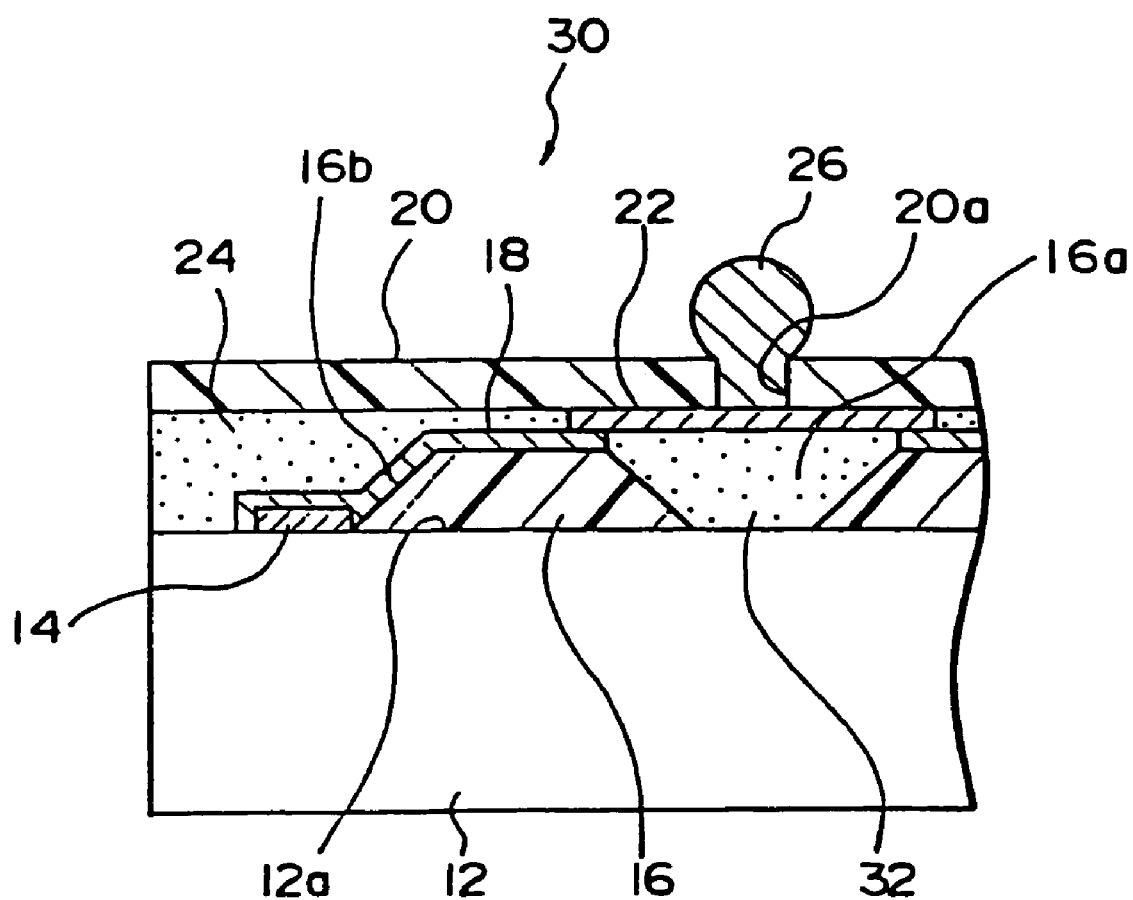
FIG. 4 shows a second embodiment of the semiconductor device.

FIG. 4 shows a second embodiment of the semiconductor device. In this figure, a semiconductor device 30 is characterized by having the depression 16a of the semiconductor device 10 shown in FIG. 1 filled with a resin 32, but is otherwise of the same construction as the semiconductor device 10. The opening outline of the depression 16a shown in FIG. 4 is considerably larger than the size of the root portion of the external electrode 26, but this is not limiting on the invention, and it may be approximately equal in size to the root portion of the external electrode 26 or not smaller than the same. The opening of the depression 16a may be positioned under a part of the root portion of the external electrode 26. In this case, this opening allows the deformation of the intermediate layer to achieve the stress absorption function. The depression 16a may be formed to penetrate the intermediate layer 16 and expose the underlying passivation film (not shown in the drawings), but equally the bottom of the depression 16a may not penetrate the intermediate layer 16 and leave a portion of the intermediate layer 16.

As the resin 32, is preferably used a polyimide resin, a silicon gel or rubber or the like such as is used, for example, as a photosensitive resist, selected to be soft, having a Young's modulus lower than the intermediate layer 16. If this is done, since the space formed by the depression 16a can be filled, when heat is applied in reflow processes and so forth, the occurrence of cracks due to the expansion of air or steam can be prevented.

The resin 32 may be inserted before applying the substrate 20, or a hole may be formed in the substrate 20, and the resin inserted through the hole after applying the substrate 20.

The filling of the depression with resin as in this embodiment can equally be applied to all of the below embodiments.

Third Embodiment

Figure 5:
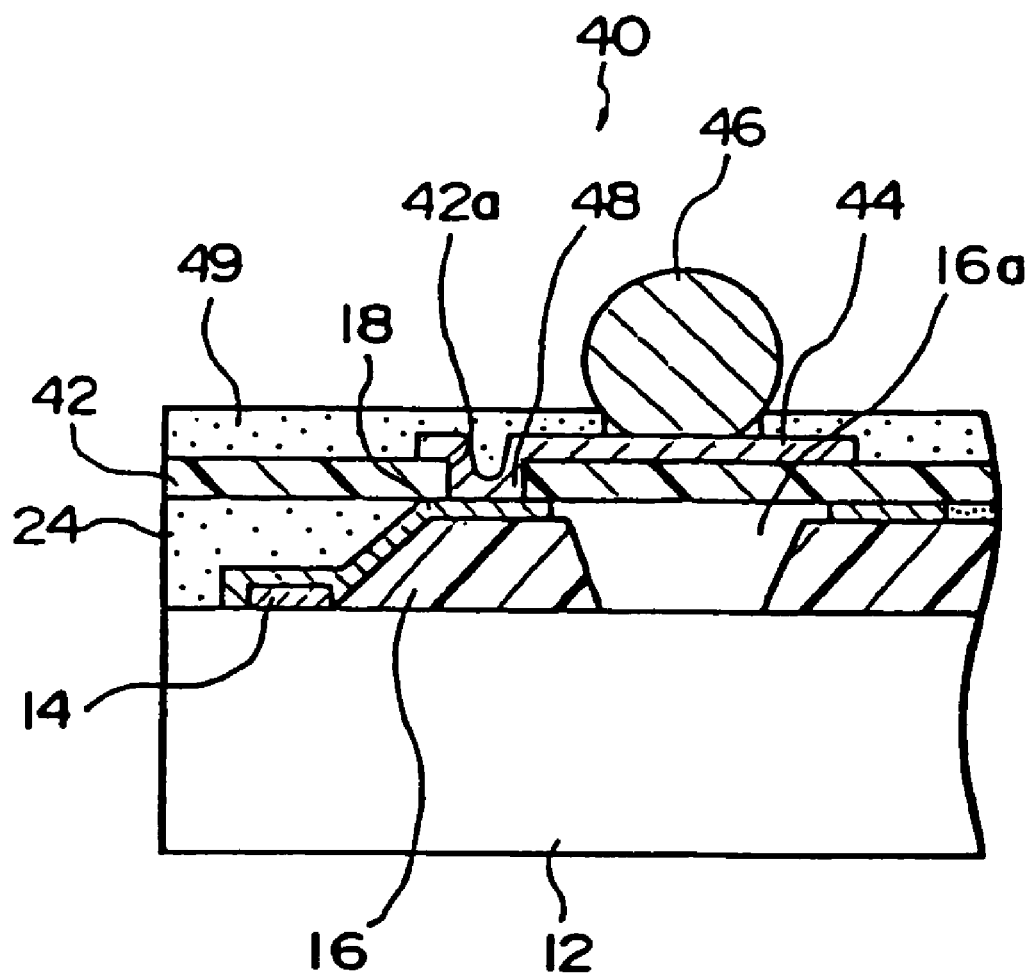
FIG. 5 shows a third embodiment of the semiconductor device.

FIG. 5 shows a third embodiment of the semiconductor device. In this figure, a semiconductor device 40, like the semiconductor device 10 shown in FIG. 1, has a semiconductor chip 12, electrode 14, intermediate layer 16, and wire 18, and in the intermediate layer 16 a depression 16a is formed.

On the intermediate layer 16 a substrate 42 is adhered by an adhesive 24. The substrate 42 is a film formed of, for example, a material such as the polyimide resin cited in the first embodiment for the material of the intermediate layer 16, having a low Young's modulus. On the substrate 42, a conductive foil 44 is formed patterned in the formed of a wire, and on the conductive foil 44 an external electrode 46 is formed. In the substrate 42 over the portion of the wire 18 positioned over the intermediate layer 16, a penetrating hole 42a is formed. In the penetrating hole 42a, an electrical junction 48 is formed, so that the conductive foil 44 and wire 18 are electrically connected. On the conductive foil 44, a solder resist layer 49 is formed to avoid the external electrode 46, and protecting the conductive foil 44.

Next, the method of manufacturing the semiconductor device 40 is described. First, in the steps shown in FIGS. 3A to 3C, on the semiconductor chip 12 the intermediate layer 16 and wire 18 are formed, and the depression 16a is formed in the intermediate layer 16.

Then on the intermediate layer 16, the substrate 42 is adhered by the adhesive 24, and the penetrating hole 42a is formed in the substrate 42. It should be noted that equally the penetrating hole 42a may be formed in the substrate 42 first, and then the adhesion step carried out.

Next, the conductive foil 44 is formed on the substrate 42. The conductive foil 44 can be formed, for example, by sputtering, electroplating, electroless plating, or the like. For the patterning of the conductive foil 44, photolithographic technology may be used. Alternatively, a pre-patterned conductive foil 44 may be provided on the substrate 42, and this then adhered on the intermediate layer 16.

Then, for example by electroless plating, or by the supplementing of electroplating, or other methods, the electrical junction 48 is provided, in a region including the penetrating hole 42a in the substrate 42.

Next, on the conductive foil 44, the solder resist layer 49 is provided, avoiding the region of formation of the external electrode 46, and then the external electrode 46 is formed. The method of formation of the external electrode 46 is the same as the method of formation of the external electrode 26 in the first embodiment.

With the semiconductor device 40 fabricated as described above, again the depression 16a is formed in the intermediate layer 16, and therefore stress applied to the external electrode 26 can be absorbed.

Fourth Embodiment

Figure 6:
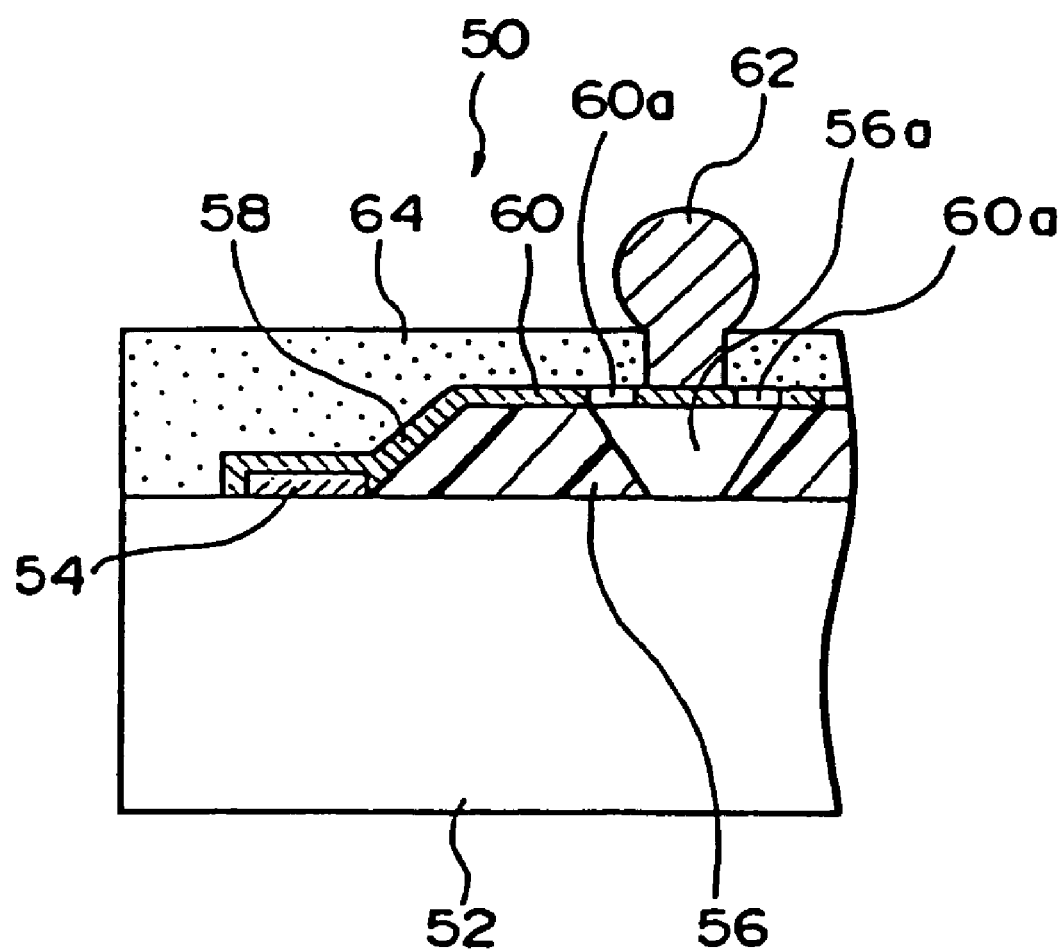
FIG. 6 shows a fourth embodiment of the semiconductor device.

FIG. 6 shows a fourth embodiment of the semiconductor device. In this figure, a semiconductor device 50, like the semiconductor device 10 shown in FIG. 1, has an intermediate layer 56 formed on a semiconductor chip 52 which has an electrode 54, and in the intermediate layer 56 a depression 56a is formed. A wire 58 is formed from the electrode 54 over the intermediate layer 56, and a conductive foil 60 is formed on the intermediate layer 56 integrally with the wire 58. In the conductive foil 60, at least one hole 60a is formed. Then over the region of the depression 56a in the conductive foil 60, an external electrode 62 is formed. A solder resist layer 64 is formed on and protects the wire 58 and conductive foil 60, avoiding the external electrode 62.

This embodiment has a characteristic method of manufacture. FIGS. 7A to 8C illustrate the method of manufacturing this embodiment of the semiconductor device.

In this embodiment, since a substrate is not used, it is preferable that after the intermediate layer 56, external electrode 62, and the like are formed on a wafer, this is subjected to dicing. In contrast to this, in embodiments where a substrate is used (the first to third embodiments), it is possible to adhere individual semiconductor chips on a substrate in tape form.

Figure 7A:
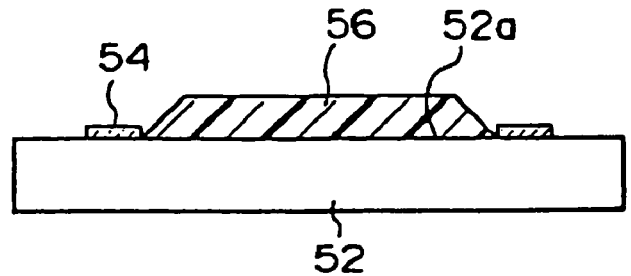
FIGS. 7A to 7D illustrate the method of manufacturing the fourth embodiment of the semiconductor device.

First, as shown in FIG. 7A, on an active surface 52a of the semiconductor chip 52, the intermediate layer 56 is formed, avoiding the electrode 54. The intermediate layer 56 is formed of a material similar to that of the intermediate layer 16 shown in FIG. 1. When the intermediate layer 56 is formed of a material with a low Young's modulus, the stress absorption function is achieved by the intermediate layer 56. Alternatively, the intermediate layer 56 may be formed of a hard material which does not provide a stress absorption function (for example, an inorganic substance such as magnesium oxide (MgO) or the like).

It should be noted that when the intermediate layer 56 is etched in a later step, in order that the active surface 52*a* of the semiconductor chip 52 is not etched, it is preferable that the intermediate layer 56 have a different material composition from the semiconductor passivation film. For this reason it is preferable that the intermediate layer 56 is formed of a substance which can be etched under conditions such that the material of the exposed surface of the semiconductor chip 52 is not etched.

Figure 7B:
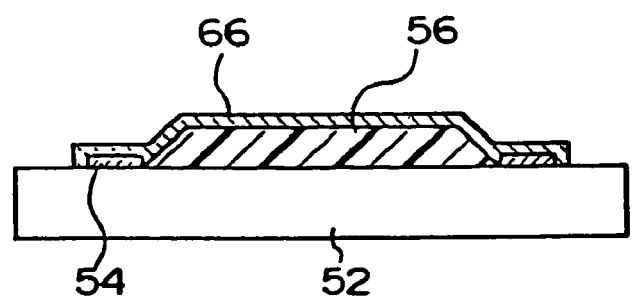

Next, as shown in FIG. 7B, a metal film 66 is formed from the electrode 54 over the intermediate layer 56. The method of manufacture thereof is the same as the method of forming a metal film by which the wire 18 of the first embodiment is formed. In this case, since the stress of an external electrode 62 described below is directly applied to the wire 58, it is preferable for the thickness of the wire 58 to be between 5 and 20 μm or thereabouts. The metal film 66 is etched in a step described below, and thus the wire 58 and conductive foil 60 are formed.

Figure 7C:
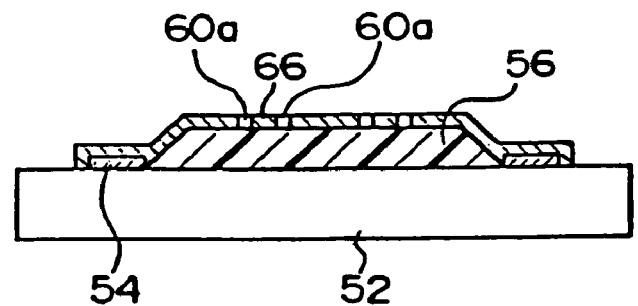
Figure 7D:
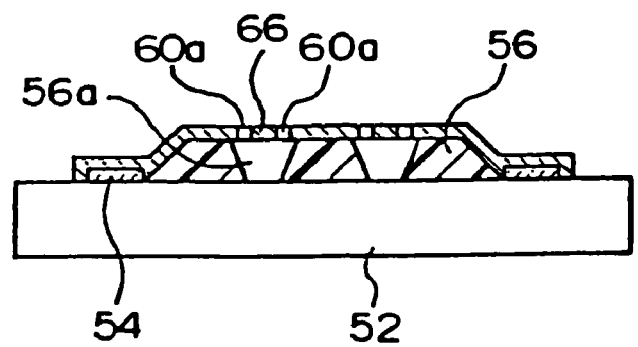

Next, as shown in FIG. 7C, holes 60*a* are formed in the metal film 66 in the portion which will form the conductive foil 60, and through the holes 60*a*, the intermediate layer 56 is exposed to an etching fluid or etching gas (etchant). For example, when the intermediate layer 56 is formed of a polyimide or similar resin, as the etchant is preferably used KOH or a similar strong alkali in aqueous solution, or a dry etching gas such as $O_2$ or $CF_4$, and when the intermediate layer 56 is formed of magnesium oxide (MgO) or the like, a hot phosphate aqueous solution or the like is preferable. Thereafter, the etchant is removed as required. In particular, in the case of a wet process, washing and rinsing steps are preferably added. In this way, as shown in FIG. 7D, the intermediate layer 56 is etched to form the depression 56*a*.

Figure 8A:
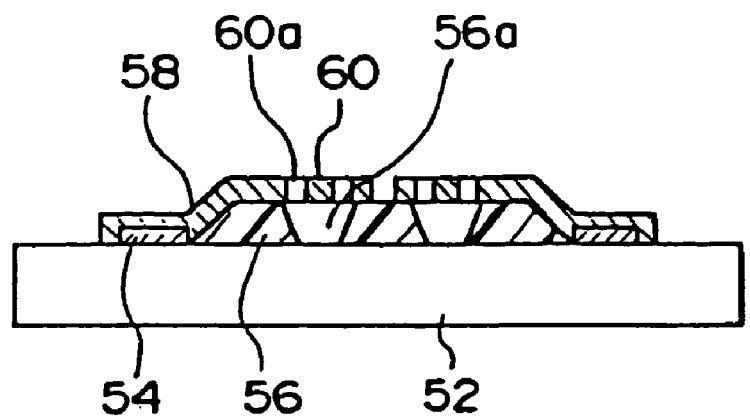
FIGS. 8A to 8C illustrate the method of manufacturing the fourth embodiment of the semiconductor device.
Figure 8B:
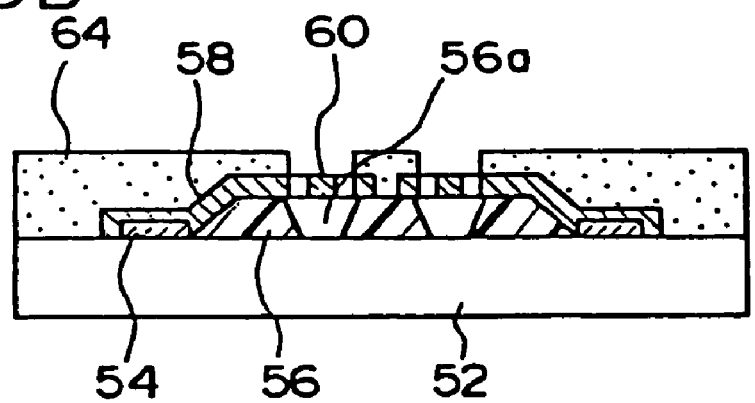
Figure 8C:
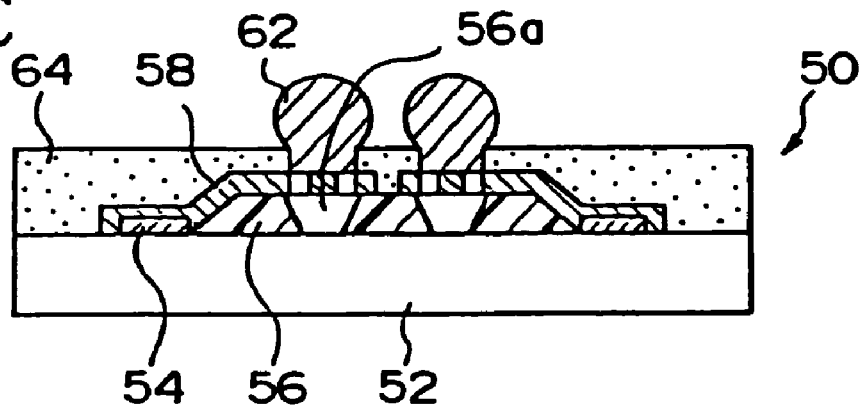

Next, as shown in FIG. 8A, the metal film 66 is patterned, and the wire 58 and conductive foil 60 are formed. Then as shown in FIG. 8B, the solder resist layer 64 is formed, and as shown in FIG. 8C the external electrode 62 is formed. As a solder resist is commonly used a photosensitive polyimide resin or epoxy resin dry film or the like. The method of forming the external electrode 62 is the same as in the first embodiment. In this way, the semiconductor device 50 is obtained. In this embodiment again, an effect similar to that of the first embodiment can be obtained.

Furthermore, the semiconductor device 50 fabricated according to this embodiment has holes 60*a* formed in the conductive foil 60, and the conductive foil 60 is thus more easily deformed. As a result, the stress absorption effect of the conductive foil 60 which is thus floating over the depression 56*a* is further improved.

Fifth Embodiment

Figure 9A:
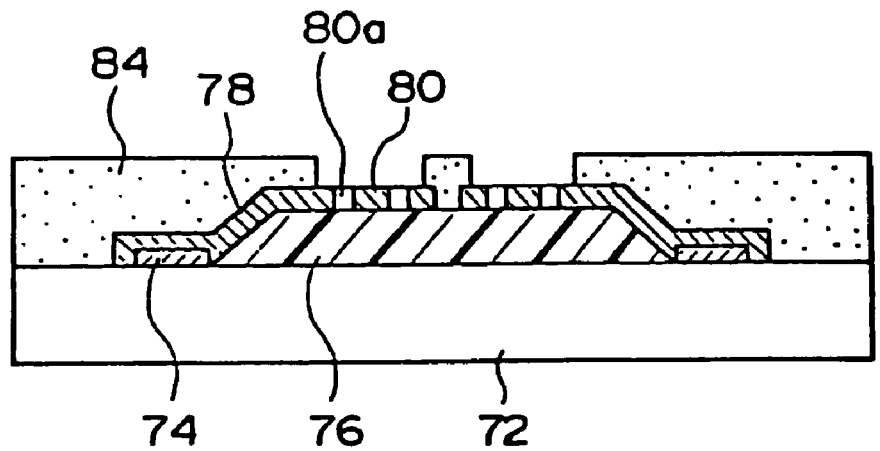
FIGS. 9A to 9C show the method of manufacturing a fifth embodiment of the semiconductor device.
Figure 9B:
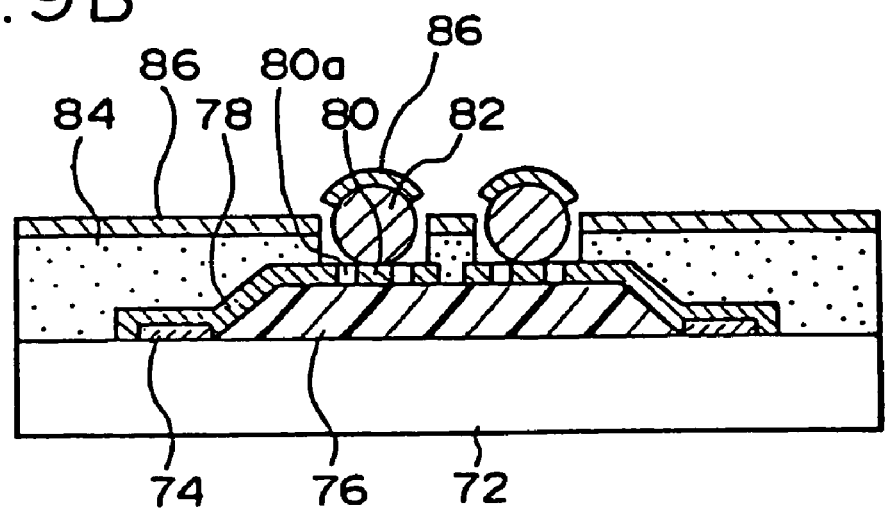
Figure 9C:
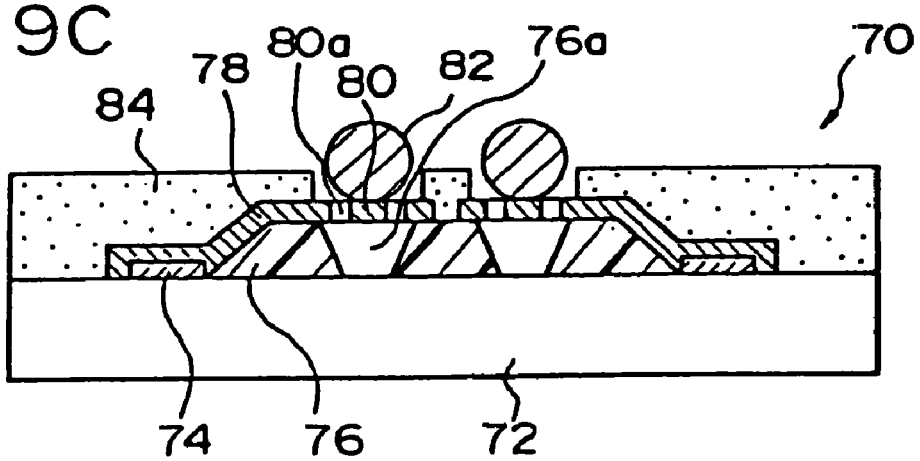

FIGS. 9A to 9C show the method of manufacturing a fifth embodiment of the semiconductor device.

In this embodiment, as shown in FIG. 9A, an intermediate layer 76 is formed on a semiconductor chip 72 having an electrode 74. On the intermediate layer 76 a conductive foil 80 is formed, and a wire 78 is formed from the conductive foil 80 to reach the electrode 74. On the wire 78 and conductive foil 80, a solder resist layer 84 is formed. In the conductive foil 80 a hole 80*a* is formed.

It should be noted that the method of formation of the intermediate layer 76 is the same as the method shown in FIG. 7A, and the method of formation of the wire 78, hole 80*a*, and conductive foil 80 is the same as shown in FIGS. 7B to 8A. A solder resist layer 84 is formed in a region to avoid the external electrodes 82 (see FIG. 9B).

Then the external electrode 82 is formed on the conductive foil 80, and the concomitant residue is removed, and on the external electrode 82 and solder resist layer 84, a covering layer 86 is formed (see FIG. 9B). The covering layer 86 is formed of a material which is not easily etched under the etching conditions of the intermediate layer 76.

Next, through the hole 80*a* in the conductive foil 80, by the same step as is shown in FIG. 7D, a depression 76*a* is formed in the intermediate layer 76, the covering layer 86 is removed, and the semiconductor device 70 shown in FIG. 9C is obtained.

According to this embodiment, the residue created when the external electrode 82 is formed is removed before the depression 76*a* is formed in the intermediate layer 76, and therefore there is no residue remaining in the depression 76*a*. The features of a semiconductor device 70 fabricated according to this embodiment are the same as in the fourth embodiment.

Sixth Embodiment

Figure 10A:
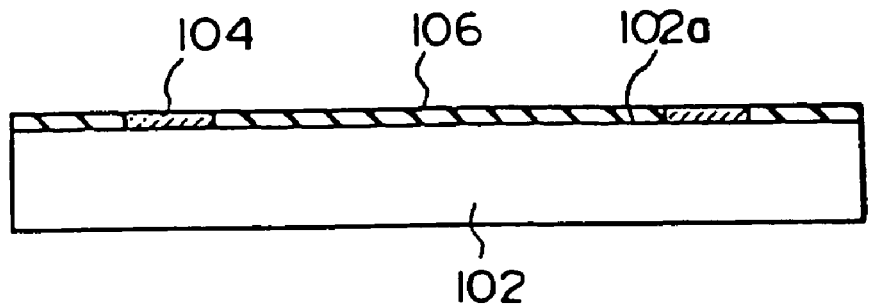
FIGS. 10A to 10C show the method of manufacturing a sixth embodiment of the semiconductor device.
Figure 10B:
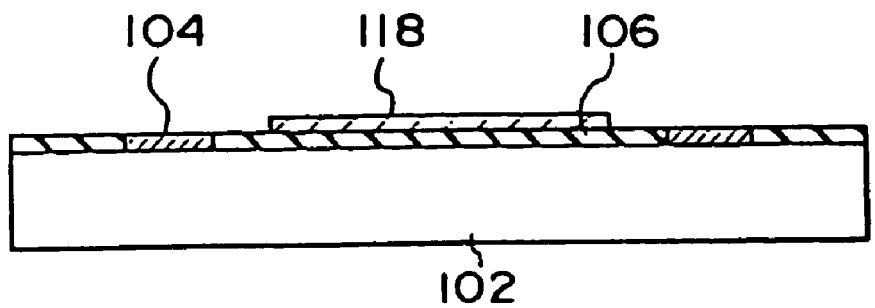
Figure 10C:
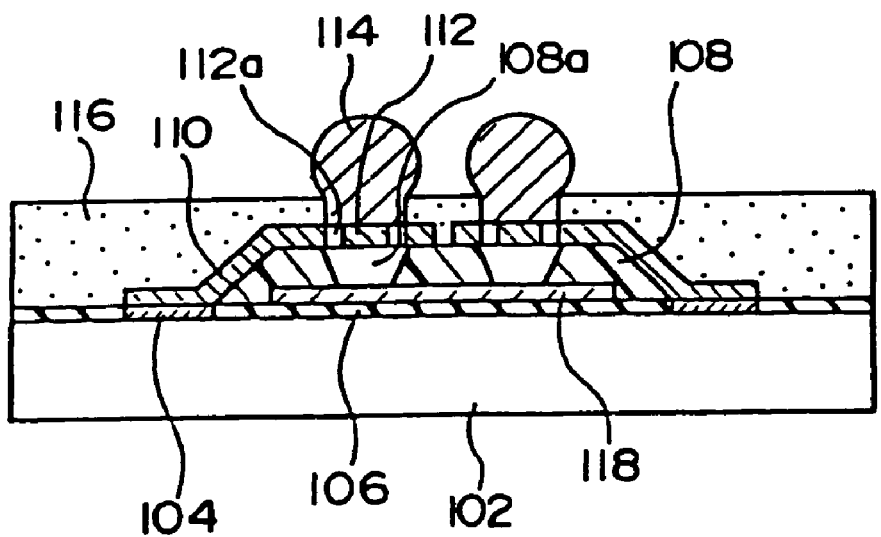

FIGS. 10A to 10C show the method of manufacturing a sixth embodiment of the semiconductor device.

In this embodiment, as shown in FIG. 10A, a semiconductor chip 102 is used in which a passivation film 106 is formed on an active surface 102*a* avoiding an electrode 104. The passivation film 106 is formed of a material sharing the properties of an intermediate layer 108 shown in FIG. 10C. In other words, the passivation film 106 is formed of a material which is etched under the etching conditions of the intermediate layer 108. For example, the intermediate layer 108 and passivation film 106 may both be formed of a polyimide resin.

In a case such as this, as shown in FIG. 10B, a covering layer 118 is formed on the passivation film 106, at least in the position under the depression 108*a* (see FIG. 10C). The covering layer 118 is formed of a material which is not etched under the etching conditions of the intermediate layer 108 and passivation film 106. For example, when the intermediate layer 108 and passivation film 106 are formed of polyimide resin, the covering layer 118 may be formed of a thin metal film of Cr, Ti—W, Ti, or the like.

Thereafter, by the same process as is shown in FIGS. 7A to 8C, as shown in FIG. 10C the intermediate layer 108 having a depression 108*a*, a wire 110, a conductive foil 112 having a hole 112*a*, an external electrode 114 and a solder resist layer 116 are formed.

According to this embodiment, since the passivation film 106 is covered by the covering layer 118, when the intermediate layer 108 is etched to form the depression 108*a*, etching as far as the passivation film 106 can be prevented. In this way, exposure of the active element within the depression 108*a* can be prevented. The characteristics of the stress absorption function are the same as in the above described embodiments.

Seventh Embodiment

Figure 11A:
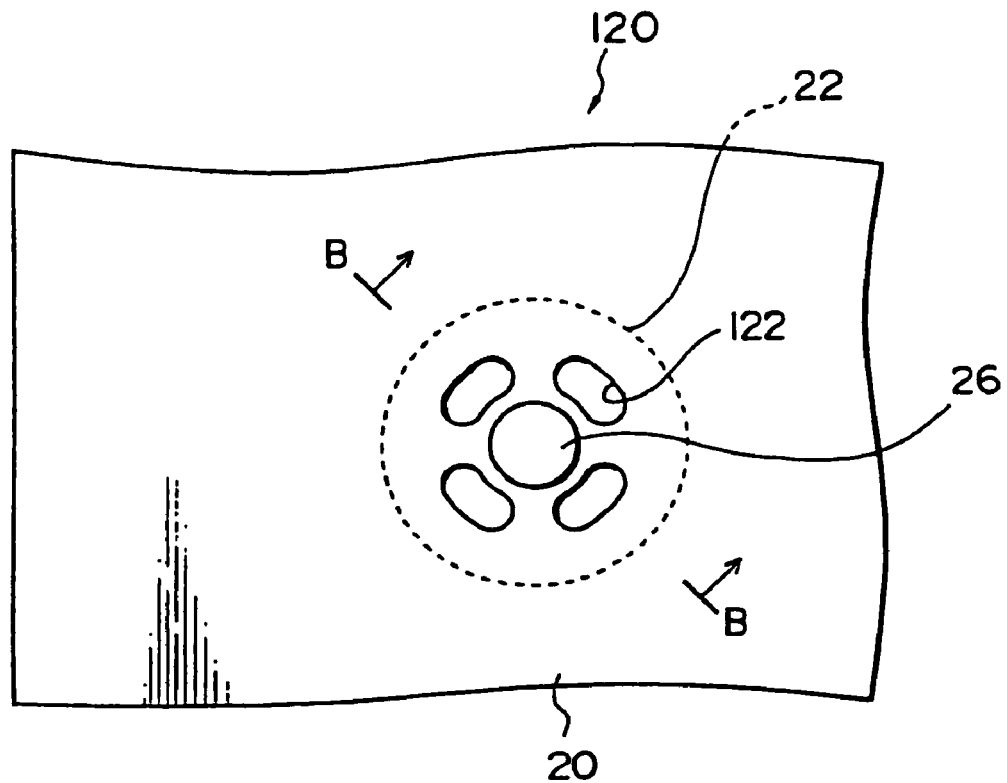
FIGS. 11A and 11B show a seventh embodiment of the semiconductor device.
Figure 11B:
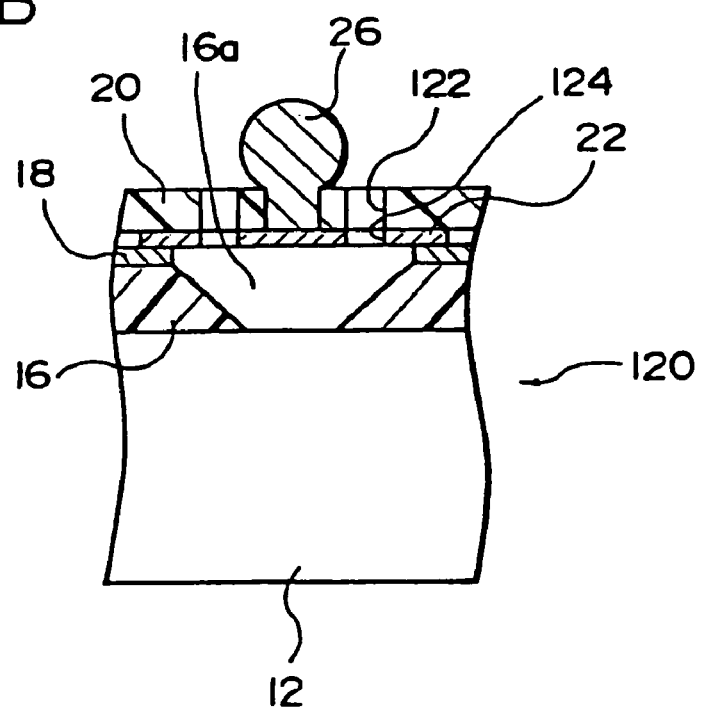

FIGS. 11A and 11B show a part of a seventh embodiment of the semiconductor device. It should be noted that FIG. 11B is a section along the line B-B in FIG. 11A. In this embodiment, a semiconductor device 120 has holes 122 and 124 formed in the substrate 20 and conductive foil 22 of the semiconductor device 10 shown in FIG. 1.

According to this embodiment, by the formation of the holes 122 and 124, the substrate 20 and conductive foil 22 are rendered more easily deformable, and the stress absorption function is increased.

Eighth Embodiment

Figure 12:
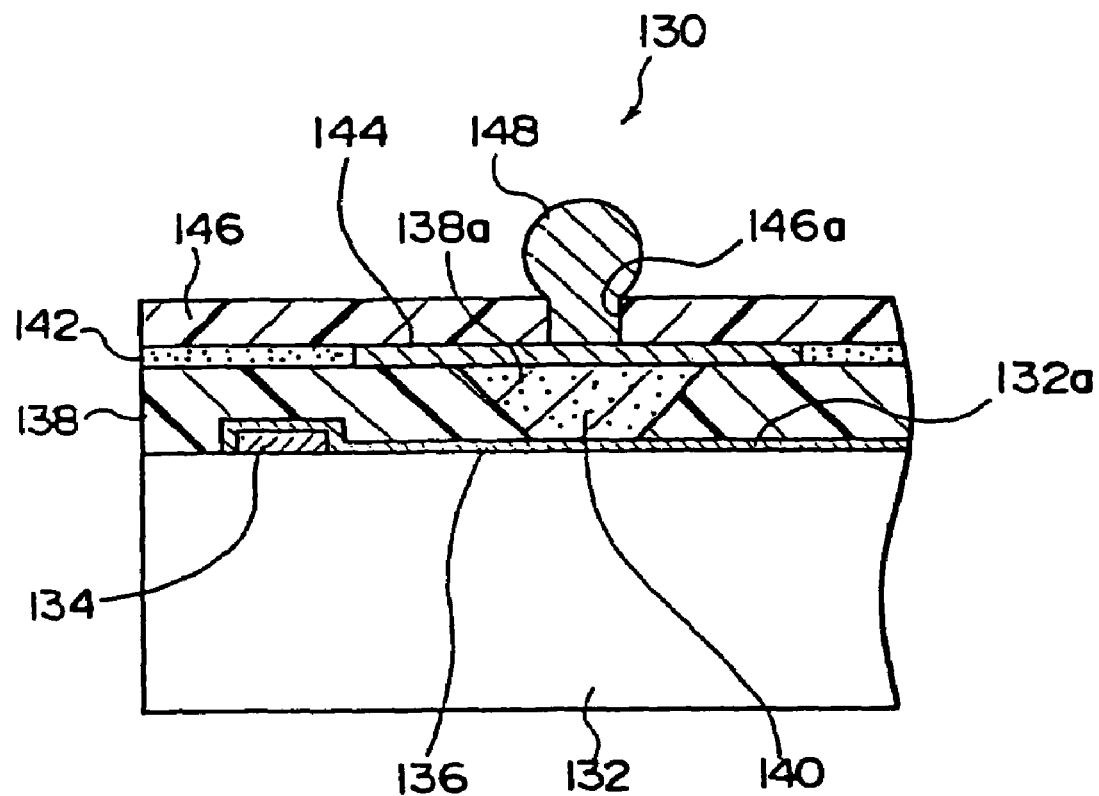
FIG. 12 shows an eighth embodiment of the semiconductor device.

FIG. 12 shows an eighth embodiment of the semiconductor device. In this figure, a semiconductor device 130 has a wire 136 formed on the active surface 132a of a semiconductor chip 132 from an electrode 134. Over the wire 136 an intermediate layer 138 is formed. Then in the intermediate layer 138 a depression 138a is formed, positioned over the wire 136, so as to expose the wire 136. On the intermediate layer 138 a substrate 146 is applied by an adhesive 142. On the substrate 146, in a position above the depression 138a and on the surface facing the depression 138a a conductive foil 144 is formed. In the substrate 146 above the depression 138a a penetrating hole 146a is formed, so that the conductive foil 144 is exposed on the opposite surface. Then an external electrode 148 is formed through the penetrating hole 146a.

Furthermore, the depression 138a is filled with a conductive paste 140. The conductive paste 140 is a soft resin similar to the resin 32 with which the depression 16a shown in FIG. 4 is filled, with the addition of a conducting filler such as silver (Ag), copper (Cu), silver-plated copper, gold (Au), or the like. By means of this conductive paste 14, the wire 136 and conductive foil 144 are electrically connected.

In this embodiment again, by virtue of the fact that the depression 138a is formed in the intermediate layer 138, the stress absorption function can be achieved.

Ninth Embodiment

FIGS. 13A to 14B show the method of manufacturing a ninth embodiment of the semiconductor device. In this embodiment, a semiconductor chip 152 is used which, like the semiconductor chip 102 shown in FIG. 10A, has a passivation film (not shown in the drawings) formed on an active surface 152a. This passivation film is formed of a material which is etched under the etching conditions of an intermediate layer 158.

Figure 13A:
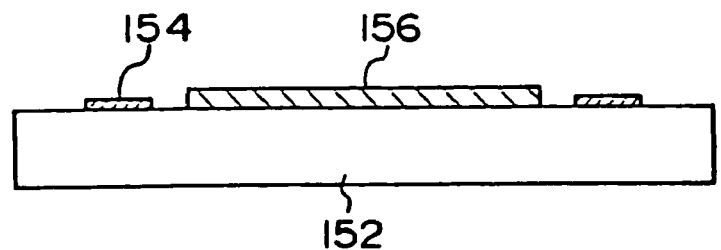
FIGS. 13A to 13D show the method of manufacturing a ninth embodiment of the semiconductor device.

As shown in FIG. 13A, a covering layer 156 is formed over the passivation film on the active surface 152a. The covering layer 156 is formed of a material (for example, chromium (Cr), titanium (Ti), titanium-tungsten (Ti—W), copper (Cu), or the like) which is not etched under the etching conditions of the intermediate layer 158. The covering layer 156 is formed, for example, by sputtering.

Figure 13B:
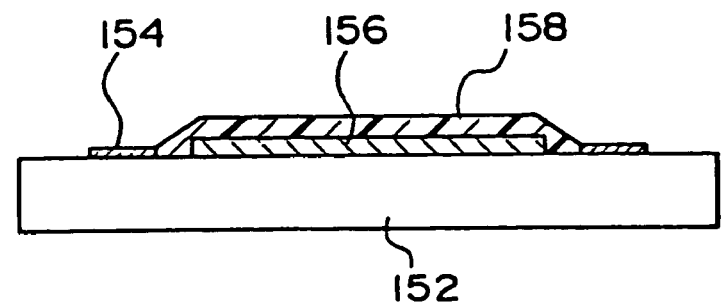

Next, as shown in FIG. 13B, the intermediate layer 158 is formed avoiding an electrode 154 including the covering layer 156. The material of the intermediate layer 158 is the same as in the first embodiment.

Figure 13C:
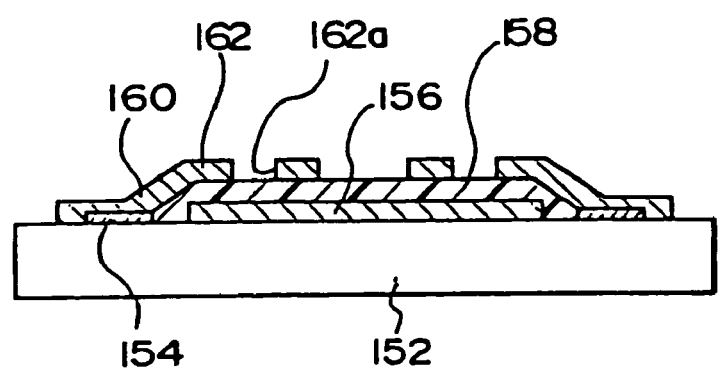

Then as shown in FIG. 13C, a wire 160 is formed from the electrode 154 over the intermediate layer 158, and a conductive foil 162 is formed to provide electrical connection to the wire 160. More specifically, by sputtering, a metal film of chromium (Cr), titanium (Ti), titanium-tungsten (Ti—W), copper (Cu), or a laminated plurality thereof, is formed, and this is patterned by etching, to form integrally the wire 160 and conductive foil 162. A hole 162a is formed in the conductive foil 162.

Figure 13D:
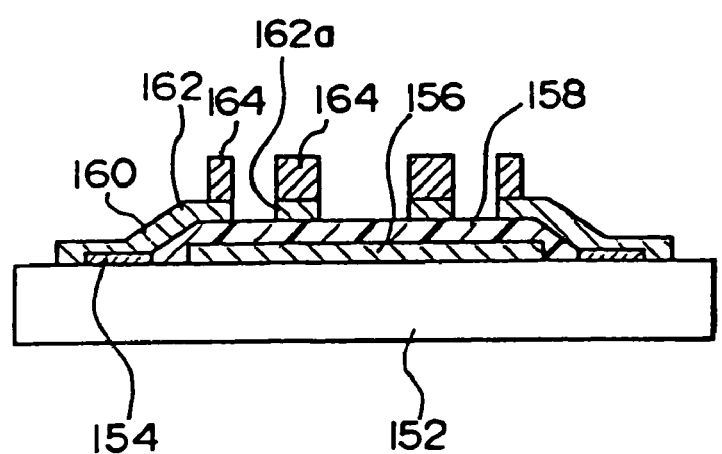

Next, as shown in FIG. 13D, an external electrode 164 is formed on the conductive foil 162. More specifically, on the conductive foil 162, bumps of copper (Cu), nickel (Ni), gold (Au), or a laminated plurality thereof are formed by electroplating or electroless plating, to form the external electrode 164.

Figure 14A:
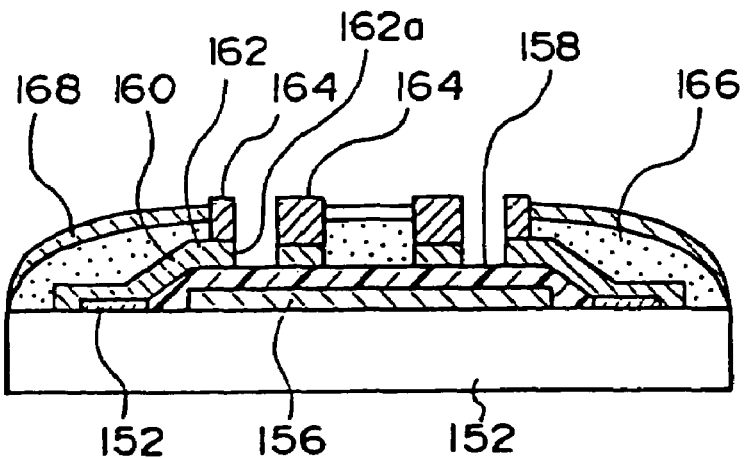
FIGS. 14A and 14B show the method of manufacturing the ninth embodiment of the semiconductor device.

Then as shown in FIG. 14A, a solder resist layer 166 is formed on the wire 160, and on the solder resist layer 166 a covering layer 168 is formed. The covering layer 168 is also formed of a material (for example, chromium (Cr), titanium (Ti), titanium-tungsten (Ti—W), copper (Cu), or the like) which is not etched under the etching conditions of the intermediate layer 158.

Figure 14B:
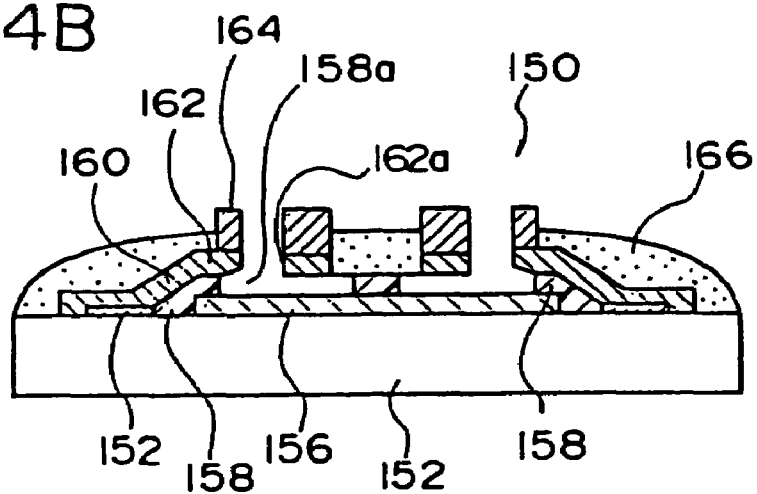

Then as shown in FIG. 14B, a depression 158a is formed in the intermediate layer 158. This step is similar to the step shown in FIG. 7D. The covering layer 168 is removed by etching. In this example, the external electrode 164 has an opening in the center, but the opening design may equally be as in the seventh embodiment.

By means of the above process, a semiconductor device 150 can be obtained. The semiconductor device 150 also achieves a stress absorption function by virtue of the depression 158a being formed in the intermediate layer 158.

Figure 15:
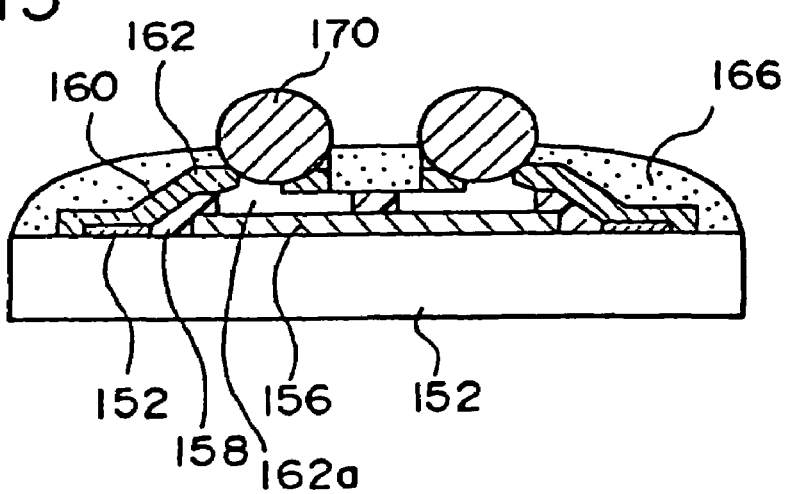
FIG. 15 shows a modification of the ninth embodiment.

It should be noted that in place of the bump-form external electrode 164 of the semiconductor device 150 shown in FIG. 14B, as shown in FIG. 15, an external electrode 170 may be formed from a solder ball on the edge of the hole 162a formed in the conductive foil 162.

It should be noted that present invention is not restricted to a CSP type semiconductor device. For example, if a deforming portion is laminated directly on the electrodes of the semiconductor chip, a semiconductor device with a stress absorption function, while of a similar size to flip-chip, is obtained.

Figure 16:
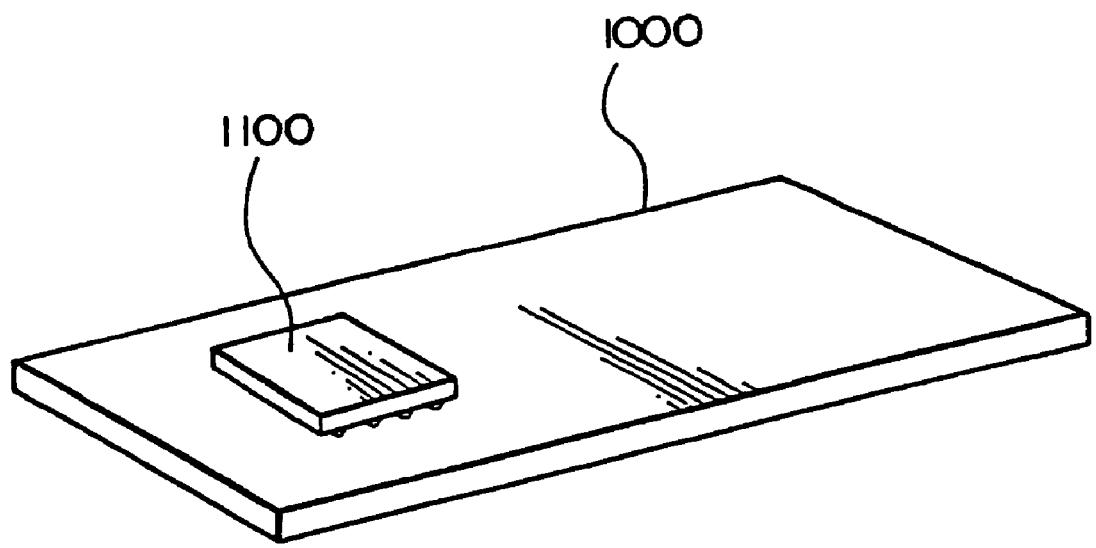
FIG. 16 shows a circuit board on which is mounted this embodiment of the semiconductor device.

In FIG. 16 is shown a circuit board 1000 on which is mounted a semiconductor device 1100 fabricated by the method of the above described embodiment. The circuit board 1000 generally uses an organic substrate such as for example a glass epoxy substrate. On the circuit board 1000, a wire pattern of for example copper is formed as a desired circuit, and on the circuit board 1000 are provided solder balls. Then by mechanically connecting the solder balls of the wire pattern and the external electrodes of the semiconductor device 1100, an electrical connection between the two is achieved.

In this case, since the construction is such that strain caused in the semiconductor device 1100 by differences in thermal expansion with the surroundings can be absorbed, even when this semiconductor device 1100 is mounted on the circuit board 1000, both at the time of connection and thereafter, the reliability can be improved.

It should be noted that the mounting area can be reduced to the mounting area for bare chip mounting. For this reason, when this circuit board 1000 is used in an electronic instrument, the electronic instrument itself can be made more compact. Within the same area, a larger mounting area is available, and higher functionality can also be achieved.

Figure 17:
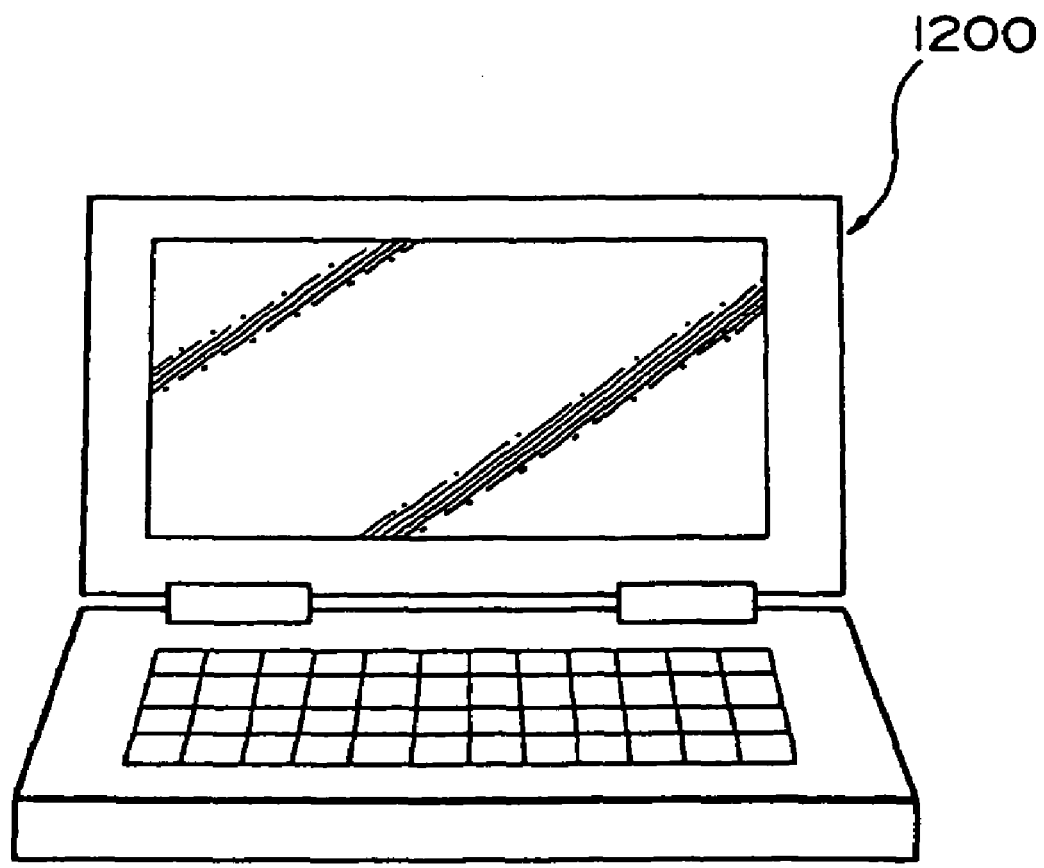
FIG. 17 shows an electronic instrument provided with a circuit board on which is mounted this embodiment of the semiconductor device.

As an example of an electronic instrument provided with this circuit board 1000, FIG. 17 shows a notebook personal computer 1200.

It should be noted that, the present invention can be applied to any surface-mounted electronic component, whether active or passive. Electronic components include, for example, resistors, capacitors, coils, oscillators, filters, temperature sensors, thermistors, varistors, variable resistors, and fuses.

What is claimed is:

1. A semiconductor device, comprising:
   a semiconductor chip that has an electrode;
   a passivation film that is formed on a surface of the semiconductor chip;
   a metal film that is formed on the passivation film;
   a resin layer that has a first portion, a second portion and a hole, the first portion being formed on the passivation film, the second portion formed on the metal film, the hole being disposed on the metal film;
   a conductive foil that is electrically connected to the electrode, the conductive foil having a first part that is formed on the resin layer; and
   an external electrode that is formed on the first part, the external electrode being formed above the hole.

2. The semiconductor device according to claim 1, the resin layer being a first resin layer, the semiconductor device further comprising:
   a second resin layer with which the hole is filled with.

3. The semiconductor device according to claim 2, a Young's modulus of the second resin layer being lower than a Young's modulus of the first resin layer.

4. The semiconductor device according to claim 1, the passivation film being formed of $SiO_2$, SiN or polyimide resin.

5. An electronic component, comprising:
   a base substrate that has an electrode;
   a passivation film that is formed on a surface of the base substrate;
   a metal film that is formed on the passivation film;
   a resin layer that has a first portion, a second portion and a hole, the first portion being formed on the passivation film, the second portion formed on the metal film, the hole being disposed on the metal film;
   a conductive foil that is electrically connected to the electrode, the conductive foil having a first part that is formed on the resin layer; and
   an external electrode that is formed on the first part, the external electrode being formed above the hole.

6. The electronic component according to claim 5, the resin layer being a first resin layer, the electronic component further comprising:
   a second resin layer with which the hole is filled with.

7. The electronic component according to claim 6, a Young's modulus of the second resin layer being lower than a Young's modulus of the first resin layer.

8. The electronic component according to claim 5, the passivation film being formed of $SiO_2$, SiN or polyimide resin.

* * * * *